United States Patent
Tan et al.

(10) Patent No.: US 9,167,687 B2
(45) Date of Patent: Oct. 20, 2015

(54) FLEXIBLE PRINTED CIRCUIT BOARD, CHIP ON FILM AND MANUFACTURING METHOD

(75) Inventors: Xiaoping Tan, Shenzhen (CN); Yu Wu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 552 days.

(21) Appl. No.: 13/515,624

(22) PCT Filed: May 17, 2012

(86) PCT No.: PCT/CN2012/075641
§ 371 (c)(1),
(2), (4) Date: Jun. 13, 2012

(87) PCT Pub. No.: WO2013/170463
PCT Pub. Date: Nov. 21, 2013

(65) Prior Publication Data
US 2013/0306360 A1    Nov. 21, 2013

(30) Foreign Application Priority Data

May 16, 2012 (CN) .......................... 2012 1 0151839

(51) Int. Cl.
*H05K 1/02* (2006.01)
*H05K 1/03* (2006.01)
*H05K 3/36* (2006.01)
(Continued)

(52) U.S. Cl.
CPC .......... *H05K 1/0296* (2013.01); *G02F 1/13452* (2013.01); *H01L 23/4985* (2013.01); *H01L 23/49838* (2013.01); *H05K 1/0393* (2013.01); *H05K 1/118* (2013.01); *H05K 1/189* (2013.01); *H05K 3/361* (2013.01); *H01L 2924/0002* (2013.01); *H05K 3/323* (2013.01);
(Continued)

(58) Field of Classification Search
CPC ... H05K 1/0296; H05K 1/0393; H05K 3/323; H05K 3/361
See application file for complete search history.

(56) References Cited

U.S. PATENT DOCUMENTS

| | | |
|---|---|---|
| 5,189,539 A | 2/1993 | Suzuki |
| 2003/0160929 A1* | 8/2003 | Kurasawa ..................... 349/149 |

FOREIGN PATENT DOCUMENTS

| | | |
|---|---|---|
| CN | 2754311 Y | 1/2006 |
| CN | 101266746 A | 9/2008 |
| CN | 101287329 A | 10/2008 |
| CN | 101304632 A | 11/2008 |

(Continued)

OTHER PUBLICATIONS

Dai Yongchao, the International Searching Authority written comments, Feb., 2013, CN.

*Primary Examiner* — Jeremy C Norris
(74) *Attorney, Agent, or Firm* — IPro, Inc.; Na Xu

(57) ABSTRACT

The invention discloses a flexible printed circuit board, a chip on film and a manufacturing method. The flexible printed circuit board used for hot pressing includes an insulating substrate with long edges; the insulating substrate is provided with a plurality of pins used for hot pressing; the pins of the flexible printed circuit board used for hot pressing are along the long edge of the insulating substrate; the spacing between two adjacent pins is gradually reduced from both ends to the middle. In the invention, after hot lamination, the spacing between the pins can almost keep constant and is equivalent to the expansion result of the LCD panel; thus, better electrical connection of the pins and the leads of the LCD panel can be ensured, and electrical contact is more reliable.

8 Claims, 2 Drawing Sheets

(51) Int. Cl.
*H01L 23/498* (2006.01)
*H05K 1/11* (2006.01)
*H05K 1/18* (2006.01)
*G02F 1/1345* (2006.01)
*H05K 3/32* (2006.01)

(52) U.S. Cl.
CPC . *H05K2201/10136* (2013.01); *Y10T 29/49124* (2015.01)

(56) References Cited

FOREIGN PATENT DOCUMENTS

| | | |
|---|---|---|
| JP | 6224254 A | 8/1994 |
| JP | 2009251182 A | 10/2009 |
| JP | 2009289905 A | 12/2009 |
| WO | WO2008078427 A1 | 7/2008 |

\* cited by examiner

FLEXIBLE PRINTED CIRCUIT BOARD, CHIP ON FILM AND MANUFACTURING METHOD

TECHNICAL FIELD

The invention relates to the field of liquid crystal displays (LCDs), and more particularly to a flexible printed circuit board (FPC), a chip on film and a manufacturing method.

BACKGROUND

The flexible printed circuit board is also called "flexible board", is a printed circuit made of a flexible insulating substrate, and has many advantages not available to a rigid printed circuit board. For example, the flexible printed circuit board can be freely bent, coiled and folded, and can be arbitrarily arranged according to space layout requirements, and arbitrarily moved, expanded and contracted in a three-dimensional space, thus achieving integration of assembly of components and wire connection. The flexible printed circuit board can be used for greatly reducing the volume of electronic products, and adapts to the need of the electronic products for development of high density, miniaturization and high reliability. Thus, FPC is widely applied in the fields or products of aerospace, military affairs, mobile communication, portable computers, computer peripheral, PDA (Personal Digital Assistant), digital cameras, etc. In a conventional flexible printed circuit board formed by hot-press laminating, because of a heat expansion effect, the positions of pins of the conventional flexible printed circuit board may be deflected; in the application occasion with enormous number of the pins and small spacing, alignment errors may easily occur if the pins are deflected, resulting in poor contact or forming wrong electrical connection.

A chip on film in an LCD panel is used as an example to explain:

An LCD device includes a backlight module and an LCD panel. The LCD panel is provided with a plurality of crisscross scan lines and data lines; the scan lines or the data lines extend to the edges of the LCD panel to form leads used for connecting with an external circuit board. Because there are enormous scan lines and data lines, and it is difficult to process by a conventional welding process, a chip on flex is generally adopted, and a hot-press laminating mode is adopted for fitting and fixing the pins of the chip on film with the pins of the data lines or the scan lines to form electrical connection. The pins on the conventional chip on film are equally spaced; the corresponding leads on the LCD panel are also equally spaced; the pins and the leads correspond one by one and keep high-precision overlapping; because the spacing among the pins and the spacing among the leads are too small, and the reliability of direct butt joint is not high, a layer of anisotropic conductive adhesive shall be arranged between the chip on film and the LCD panel; conductive particles are included in the anisotropic conductive adhesive; after the flexible printed circuit board and a glass substrate are hot laminated, the spacing among the leads and the pins is minimal; thus, anisotropic conductive adhesive in the middle is extruded, and the conductive particles among the leads and the pins are compacted, deformed and mutually butted to form an electrical pathway; one end of the electrical pathway is butted against with the lead; and the other end of the electrical pathway is butted against the pins to realize the electrical connection among the leads and the pins. The spacing among the leads and the pins is large, the conductive particles are still in a loose state, and the conductive particles are almost separated; thus, two adjacent leads or pins will not be short-circuited and the reliability of the electrical connection is enhanced.

The problem in the prior art is that: the expansion coefficient of colloid material among the leads on the flexible printed circuit board, such as chip on film, etc., is large; so during hot bonding, enormous heat of a laminating head may cause that the leads are not equally spaced; for the chip on film, the expansion extent of the corresponding LCD panel is small, resulting in that the pins of the chip on film and the leads of the LCD panel are difficult to better overlap, and signal transmission is abnormal.

SUMMARY

In view of the above-described problems, the aim of the invention is to provide a flexible printed circuit board, a chip on film and a manufacturing method with better reliability of electrical contact.

The purpose of the invention is achieved by the following technical schemes:

A flexible printed circuit board used for hot pressing comprises an insulating substrate with long edges; the insulating substrate is provided with a plurality of pins used for hot pressing; the pins, used for hot pressing, of the flexible printed circuit board are along the long edge of the insulating substrate; the spacing between two adjacent pins is gradually reduced from both ends to the middle.

Preferably, the pins are symmetrically distributed based on a longitudinal axis of the insulating substrate. This is a specific distribution form of the pins.

Preferably, the insulating substrate is made of resin material. This is a specific insulating substrate material.

A chip on film used for an LCD panel comprises an insulating substrate with long edges; the insulating substrate is provided with an integrated circuit (IC); both ends of the IC are provided with pins; the pins extend to the side of the insulating substrate; the pins, used for hot pressing with the LCD panel, of the chip on film are along the long edge of the insulating substrate; the spacing between two adjacent pins is gradually reduced from both ends to the middle.

Preferably, the spacing between two adjacent pins is gradually reduced from both ends to the middle on one side of the chip on film connected with the LCD panel. The pins on one side of the chip on film connected with the LCD panel are concentrated; during hot-press lamination, the heat expansion of the insulating substrate easily causes displacement of the pins; thus, the pins on this side are necessary to adopt a non-equidistant design. The other side of the chip on film is connected with a circuit board; the pins on this side are much fewer and the spacing among the pins is also larger; the heat expansion has a smaller effect on the alignment of the pins; thus, a conventional equidistant design can be adopted; thus, the spacing design on one side is omitted, favoring the reduction of development cost.

Preferably, the pins are symmetrically distributed based on the longitudinal axis of the insulating substrate. This is a specific distribution form of the pins.

Preferably, the insulating substrate is made of resin material. This is a specific insulating substrate material.

A method used for manufacturing a flexible printed circuit board used for hot pressing comprises the steps:

A: Obtaining the expansion value of the edge(s) of the hot-pressed insulating substrate of the flexible printed circuit board used for hot-pressing;

B: Computing the distance difference value of the spacing between two adjacent pins which are gradually reduced from both ends to the middle of the insulating substrate according to the expansion value obtained in step A;

C: Manufacturing pins of the flexible printed circuit board used for hot pressing according to the spacing of the distance difference value in step B.

A method for manufacturing a chip on film of an LCD panel comprises the steps:

A: Obtaining the expansion value of the edge(s) of the hot-pressed insulating substrate of the chip on film;

B: Computing the distance difference value of the spacing between two adjacent pins which are gradually reduced from both ends to the middle of the insulating substrate according to the expansion value obtained in step A;

C: Manufacturing pins of the chip on film according to the spacing of the distance difference value in step B.

It is found in the invention through study that enormous heat during hot lamination causes that the insulating substrate on the flexible printed circuit board such as the chip on film, etc. expands towards both sides, and the pins gradually deflect to both ends, resulting in that the spacing between two adjacent pins becomes larger and larger from both ends to the middle. According to the phenomenon, the leads of the flexible printed circuit board of the invention are designed to gradually increase from the middle to both sides, namely the spacing between two adjacent leads is gradually reduced in the direction from both sides to the middle. During lamination, because the material in the middle area of the flexible printed circuit board is concentrated and the expansion range is large, the spacing between two adjacent pins will be greatly increased; the concentration extent of the material to both sides is gradually reduced, the expansion space is also gradually reduced, and the increase range of the spacing between two adjacent pins is also gradually reduced; thus, after hot lamination, the spacing between the pins can almost keep constant and is equivalent to the expansion result of the LCD panel; thus, better electrical connection of the pins and the leads of the LCD panel can be ensured, and electrical contact is more reliable.

Legends: 100. LCD panel; 110. lead; 200. chip on film; 210. insulating substrate; 220. pin; 230. IC; 300. anisotropic conductive adhesive layer.

DETAILED DESCRIPTION

The invention will further be described in detail in accordance with the figures and the preferable examples.

The invention provides a novel flexible printed circuit board. The invention will further be described in detail in the example by using a chip on film as an example.

Figure 1:
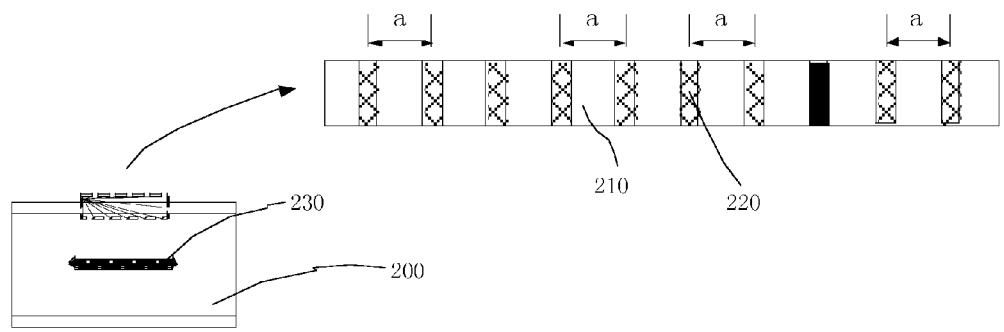
FIG. 1 is a schematic diagram of a conventional LCD panel.
Figure 2:
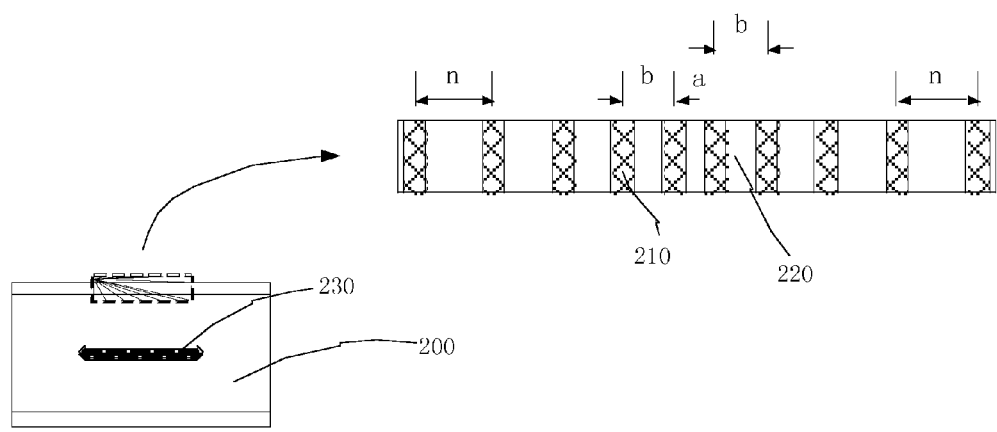
FIG. 2 is a schematic diagram of a flexible printed circuit board of an example of the invention.
Figure 3:
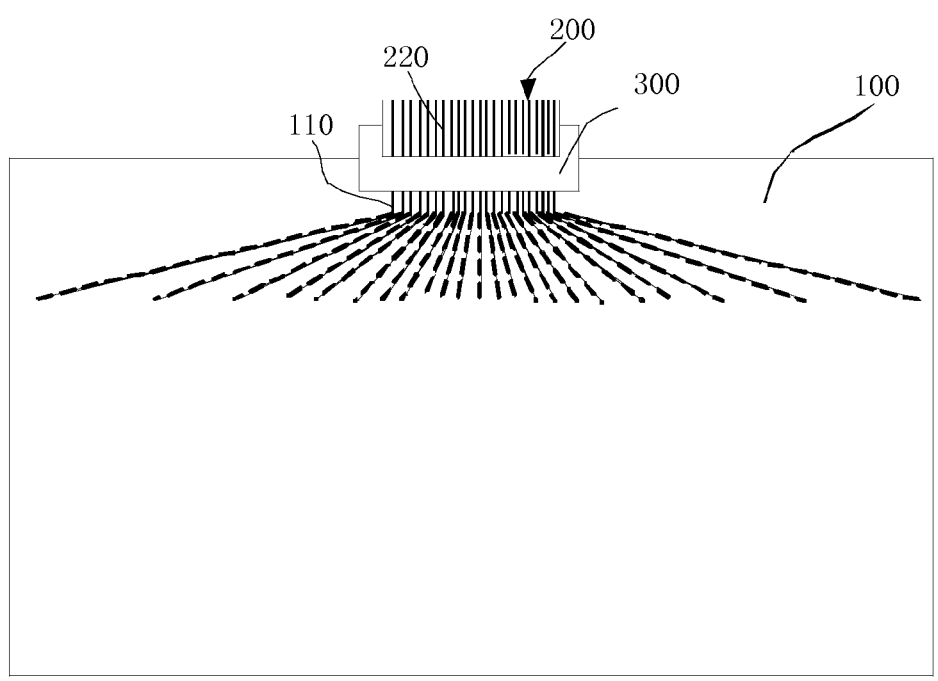
FIG. 3 is a schematic diagram of an LCD panel of an example of the invention.

As shown in FIG. 2 to FIG. 3, the LCD panel is provided with a plurality of criss-cross scan lines and data lines; the scan lines and the data lines are at the edges of the LCD panel 100; the spacing among the scan lines and the data lines will be constricted to form a plurality of leads. The chip on film 200 of the invention comprises an insulating substrate 210 with long edges; the insulating substrate 210 is provided with an IC 230, and both ends of the IC are provided with pins 220; the pins 220 extend to two long sides of the insulating substrate 210; the pins, used for hot pressing with the LCD panel, of the chip on film 200 are along the long edge of the insulating substrate; the spacing between two adjacent pins 220 is gradually reduced from both ends to the middle. The pins 220 of the chip on film 200 correspond to the leads 110 of the LCD panel one by one. The insulating substrate 210 can be made of resin material, and the pins 220 can be symmetrically distributed based on the longitudinal axis of the insulating substrate 210.

The spacing between two adjacent pins 220 is gradually reduced from both ends to the middle on one side of the chip on film 200 connected with the LCD panel. The pins 220 on one side of the chip on film 200 connected with the LCD panel are concentrated, so during hot-press lamination, the heat expansion of the insulating substrate 210 easily causes displacement of the pins 220; thus, the pins on this side are necessary to adopt a non-equidistant design. The other side of the chip on film 200 is connected with a circuit board; the pins on this side are much fewer and the spacing among the pins is also larger; the heat expansion has smaller effect on the alignment of the pins; thus, a conventional equidistant design can be adopted; thus, the spacing design on one side is omitted, favoring the reduction of development cost.

An anisotropic conductive adhesive layer 300 is arranged between the chip on film 200 and the LCD panel; the leads and the pins 220 realize electrical connection through the anisotropic conductive adhesive layer 300. Conductive particles are included in the anisotropic conductive adhesive layer; after the chip on film 200 and the glass substrate are hot laminating, the spacing among the leads and the pins 220 is minimal; thus, anisotropic conductive adhesive in the middle is extruded, and the conductive particles among the leads and the pins 220 are compacted, deformed and mutually butted to form an electrical pathway; one end of the electrical pathway is butted against with the leads; and the other end of the electrical pathway is butted against the pins 220 to realize the electrical connection among the leads and the pins 220. The spacing among the leads and the pins 220 is large, the conductive particles are still in a loose state, and the conductive particles are almost separated; thus, two adjacent leads or pins 220 will not be short-circuited and the reliability of the electrical connection is enhanced.

It is found in the invention through study that enormous heat during hot lamination causes that the insulating substrate on the flexible printed circuit board such as the chip on film, etc. expands towards both sides, and the pins gradually deflect to both ends, resulting in that the spacing between two adjacent pins becomes larger and larger from both ends to the middle. According to the phenomenon, the leads of the flexible printed circuit board of the invention are designed to gradually increase from the middle to both sides, namely the spacing between two adjacent leads is gradually reduced in the direction from both sides to the middle. During lamination, because the material in the middle area of the flexible printed circuit board is concentrated and the expansion range is large, the spacing between two adjacent pins will be greatly increased; the concentration degree of the material to both sides is gradually reduced, the expansion space is also gradually reduced, and the increase range of the spacing between two adjacent pins is also gradually reduced; thus, after hot lamination, the spacing between the pins can almost keep constant and is equivalent to the expansion result of the LCD panel; thus, better electrical connection of the pins and the leads of the LCD panel can be ensured, and electrical contact is more reliable.

The invention also discloses a method for manufacturing a flexible printed circuit board used for hot pressing, comprising the steps:

A: Obtaining the expansion value of the edge(s) of the hot-pressed insulating substrate of the flexible printed circuit board used for hot pressing;

B: Computing the distance difference value of the spacing between two adjacent pins which are gradually reduced from both ends to the middle of the insulating substrate according to the expansion value obtained in step A;

C: Manufacturing pins of the flexible printed circuit board used for hot pressing according to the spacing of the distance difference value in step B.

The invention also discloses a method for manufacturing a chip on film of an LCD panel, comprising the steps:

A: Obtaining the expansion value of the edge(s) of the hot-pressed insulating substrate of the chip on film;

B: Computing the distance difference value of the spacing between two adjacent pins which are gradually reduced from both ends to the middle of the insulating substrate according to the expansion value obtained in step A;

C: Manufacturing pins of the chip on film according to the spacing of the distance difference value in step B.

The invention is described in detail in accordance with the above contents with the specific preferred examples. However, this invention is not limited to the specific examples. For the ordinary technical personnel of the technical field of the invention, on the premise of keeping the conception of the invention, the technical personnel can also make simple deductions or replacements, and all of which should be considered to belong to the protection scope of the invention.

We claim:

1. A flexible printed circuit board used for hot pressing, comprising: an insulating substrate with long edges; wherein said insulating substrate is provided with a plurality of pins used for hot pressing; the pins of said flexible printed circuit board are used for hot pressing are arranged along the long edge of the insulating substrate; spacing/distance/intervals between each two adjacent pins gradually decrease from both lateral ends to the middle along the long edge of the insulating substrate.

2. The flexible printed circuit board used for hot pressing of claim 1, wherein said pins are symmetrically distributed based on the longitudinal axis of the insulating substrate.

3. The flexible printed circuit board used for hot pressing of claim 1, wherein said insulating substrate is made of resin material.

4. A chip on film used for an LCD panel, comprising: an insulating substrate with long edges; said insulating substrate is provided with an IC; both ends of said IC are provided with pins; said pins extend to the side of said insulating substrate; the pins used for hot pressing with the LCD panel of said chip on film are arranged along the long edge of the insulating substrate; spacing/distance/intervals between each two adjacent pins gradually decrease from both lateral ends to the middle along the long edge of the insulating substrate.

5. The chip on film used for the LCD panel of claim 4, wherein the spacing between two adjacent pins is gradually reduced from both ends to the middle on one side of the chip on film connected with the LCD panel.

6. The chip on film used for the LCD panel of claim 4, wherein said pins are symmetrically distributed based on the longitudinal axis of the insulating substrate.

7. The chip on film used for the LCD panel of claim 4, wherein said insulating substrate is made of resin material.

8. A method for manufacturing a chip on film of an LCD panel, comprising the steps:

A: obtaining the expansion value of the edge(s) of the hot-pressed insulating substrate of the chip on film;

B: computing the distance difference value of the spacing/distance/intervals between each two adjacent pins which gradually reduced decrease from both lateral ends to the middle along the long edge of the insulating substrate according to the expansion value obtained in step A;

C: manufacturing pins of the chip on film according to the spacing of the distance difference value in step B.

* * * * *